United States Patent
Liu et al.

(10) Patent No.: US 11,552,207 B2
(45) Date of Patent: *Jan. 10, 2023

(54) MULTI-LAYER BACK SURFACE FIELD LAYER IN A SOLAR CELL STRUCTURE

(71) Applicant: THE BOEING COMPANY, Chicago, IL (US)

(72) Inventors: Xing-Quan Liu, Arcadia, CA (US); Daniel C. Law, Arcadia, CA (US); Eric Michael Rehder, Los Angeles, CA (US); Christopher M. Fetzer, Valencia, CA (US); Richard R. King, Thousand Oaks, CA (US)

(73) Assignee: THE BOEING COMPANY, Chicago, IL (US)

( * ) Notice: Subject to any disclaimer, the term of this patent is extended or adjusted under 35 U.S.C. 154(b) by 246 days.

This patent is subject to a terminal disclaimer.

(21) Appl. No.: 16/413,112

(22) Filed: May 15, 2019

(65) Prior Publication Data
US 2019/0267501 A1    Aug. 29, 2019

Related U.S. Application Data

(63) Continuation of application No. 13/239,969, filed on Sep. 22, 2011, now Pat. No. 10,340,401.

(51) Int. Cl.
*H01L 31/0687* (2012.01)
*H01L 31/0304* (2006.01)
(Continued)

(52) U.S. Cl.
CPC .. *H01L 31/03046* (2013.01); *H01L 31/02167* (2013.01); *H01L 31/0687* (2013.01); *H01L 31/1844* (2013.01); *Y02E 10/544* (2013.01)

(58) Field of Classification Search
None
See application file for complete search history.

(56) References Cited

U.S. PATENT DOCUMENTS 6,150,603 A * 11/2000 Karam ............ H01L 31/068
                                                          136/252
7,119,271 B2  10/2006 King et al.
(Continued)

FOREIGN PATENT DOCUMENTS

CN    101931029 A    12/2010
JP    S60218881 A    11/1985
(Continued)

OTHER PUBLICATIONS

Dimorth, F et al.; "MOVEPE Grown Ga1—xInxAs Solar Cells for GaInP/GaInAs Tandem Applications" Journal of Electronic Materials, 2000, pp. 42-46, vol. 29, No. 1.
(Continued)

*Primary Examiner* — Dustin Q Dam
(74) *Attorney, Agent, or Firm* — Armstrong Teasdale LLP

(57) ABSTRACT

Photovoltaic (PV) cell structures are disclosed. In one example embodiment, a PV cell includes an emitter layer, a base layer adjacent to the emitter layer, and a back surface field (BSF) layer adjacent to the base layer. The BSF layer includes a first layer, and a second layer adjacent to the first layer. The first layer includes a first material and the second layer includes a second material different than the first material.

19 Claims, 4 Drawing Sheets

(51) Int. Cl.
  *H01L 31/18* (2006.01)
  *H01L 31/0216* (2014.01)

(56) References Cited

U.S. PATENT DOCUMENTS

| | | | |
|---|---|---|---|
| 2003/0070707 | A1 | 4/2003 | King et al. |
| 2003/0145884 | A1* | 8/2003 | King ............... H01L 31/0725 136/255 |
| 2011/0124146 | A1* | 5/2011 | Pitera ............... H01L 31/0735 438/64 |
| 2012/0042945 | A1 | 2/2012 | Ji et al. |

FOREIGN PATENT DOCUMENTS

| | | |
|---|---|---|
| JP | H08204215 A | 8/1996 |
| JP | 2000332282 A | 11/2000 |

OTHER PUBLICATIONS

European Search Report regarding European Patent Application No. 19188173.9 dated Oct. 25, 2019; pp. 1-8.
EP Office Action for related application 12185114.1 dated Jun. 19, 2018; 14 pp.
Notice of Reasons for Rejection for Japanese Patent Application No. 2012-208411, dated Jul. 28, 2016, 3 pages.
First Office Action for related CN Appln. No. 20120352495.5 dated Nov. 20, 2015, 12 pages.
European Search Report issued in European Application No. 12185114. 1-1528, dated Jan. 23, 2013, 9 pages.
Kurita, H. et al., "High-Efficiency Monolithic InGaP/GaAs Tandem Solar Cells With Improved Top-Cell Back-Surface-Field Layers," Proceedings of the International Conference on Indium Phosphide and Related Materials, New York, IEEE, US, vol. Conf. 7, May 9, 1995, pp. 516-519.
Rafat, N.H., et al., "Back Surface Fields For N/P and P/N GAINP Solar Cells," World Conference on Photovoltaic Energy, Waikoloa, New York, IEEE, vol. Conf 1, Dec. 5-9, 1994, pp. 1906-1909.
Benslimane, H., et al., "Theoretical Performance of GaAS Solar Cell, With Band Gap Gradient Layer On The Back Region," Microelectronics (ICM), 2009 International Conference on IEEE, Piscataway, New Jersey, Dec. 19, 2009, pp. 398-401.
Timo, G., et al., "Preliminary Investigation on Triple Junction InGaP/InGaAs/Ge Solar Cells Grown on Thin Wafers for Space and Terrestrial Application," Proceedings of the 21st European Photovoltaic Solar Energy Conference, Sep. 4-8, 2006, pp. 29-34.
Andreas W. Bett, et al., "Highest Efficiency Multi-Junction Solar Cell for Terrestrial and Space Applications", 24th European Photovoltaic Solar Energy Conference and Exhibition, Sep. 21-25, 2009, 6 pages.

\* cited by examiner

MULTI-LAYER BACK SURFACE FIELD LAYER IN A SOLAR CELL STRUCTURE

CROSS-REFERENCE TO RELATED APPLICATIONS

This application is a continuation of, and claims priority to, U.S. patent application Ser. No. 13/239,969, filed Sep. 22, 2011, for "MULTI-LAYER BACK SURFACE FIELD LAYER IN A SOLAR CELL STRUCTURE", which is incorporated by reference herein in its entirety.

BACKGROUND

The field of the disclosure relates generally to solar energy conversion devices, and more particularly to a multi-layer back surface field layer in a solar cell structure.

Interest in photovoltaic ("PV") cells in both terrestrial and non-terrestrial applications has increased as concerns over pollution and limited resources continue. Regardless of the application of such cells, efforts have been ongoing to increase the output and/or increase the efficiency of PV cells.

Some known PV cell structures include a cell base with layers lattice matched to substrates with relatively high bandgaps. A back surface field (BSF) layer is often used between a cell base portion of a solar cell and the substrate or layers next to the base layer to reduce electron-hole recombination at the interface, block minority carriers from diffusing away from the pn junction and to thereby increase the cell's efficiency. The BSF layer is commonly lattice-matched to the cell lattice constant. The relatively large cell band gaps in such structures, however, reduce the efficiency of the solar cell structure.

Some multijunction terrestrial PV cell structures, utilize an upright metamorphic design with a larger lattice constant and a wider bandgap range to better split the solar spectrum, and therefore to increase efficiency. Some such PV cell structures may have a cell base bandgap range from about 0.7 eV to about 2.0 eV. To lattice match the BSF layer to the larger cell lattice constant in metamorphic PV cell structures, indium is often added to the BSF layer. For example, some known upright metamorphic PV cells use an AlGaInAs or ALGaInP BSF layer. In at least one known metamorphic PV cell structure, the BSF layer includes about twenty percent indium and about sixty percent aluminum. Although the added indium increases the lattice constant of the BSF layer, the indium also reduces the bandgap of the BSF layer. As a result, some known metamorphic PV cell structures have an indirect bandgap below 2.0 eV. At such a relatively low bandgap relative to the cell base bandgap, the BSF layer may not function as effectively as desired, and efficiency of such a PV cell may be reduced. Moreover, p-doping with carbon in the BSF layer is limited because of the indium etching effect of carbon. Thus, at least some known metamorphic PV cell structures that include indium in the BSF layer are limited to p-doping of less than about $10^{18}$ cm$^{-3}$.

BRIEF DESCRIPTION

In one exemplary embodiment, a photovoltaic (PV) cell includes an emitter layer, a base layer adjacent to the emitter layer, and a back surface field (BSF) layer adjacent to the base layer. The BSF layer includes a first layer adjacent to the base layer, and a second layer adjacent to the first layer. The first layer includes a first material and the second layer includes a second material different than the first material.

In another exemplary embodiment, a photovoltaic (PV) cell includes an emitter layer, a base layer adjacent to the emitter layer, and a back surface field (BSF) layer adjacent to the base layer. The emitter layer and the base layer establish a cell lattice constant. The BSF layer includes a first layer adjacent to the base layer, and a second layer adjacent to the first layer. The first layer is mismatched to the cell lattice constant, and the second layer is matched to the cell lattice constant.

In yet another exemplary embodiment, a photovoltaic (PV) cell includes an emitter layer, a base layer adjacent to the emitter layer, and a back surface field (BSF) layer adjacent to the base layer. The BSF layer includes a strained pseudomorphic layer adjacent to the base layer, and a lattice-matched layer adjacent to the strained pseudomorphic layer.

The features, functions, and advantages that have been discussed can be achieved independently in various embodiments or may be combined in yet other embodiments further details of which can be seen with reference to the following description and drawings.

DETAILED DESCRIPTION

As used herein, an element or step recited in the singular and proceeded with the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

As used herein, the term "lattice-mismatched" refers to an intentional mismatching of material lattice constants between layers of photovoltaic devices. The term "material lattice constant" generally refers to the lattice constant of material in a free-standing layer (i.e., when the material is "relaxed" or "fully relaxed"). A "lattice-mismatch" of a first layer with respect to a second layer is the difference between the material lattice constant of the first layer and the material lattice constant of the second layer divided by the material lattice constant of the second layer. Layers of a photovoltaic device that are "lattice-mismatched" are mismatched to a greater degree, and are thus substantially different, than layers that are "lattice-matched" or "nearly lattice-matched." As used herein, a "strained" layer has a lattice-mismatch of greater than zero percent.

Exemplary photovoltaic (PV) cell structures are described herein. Each exemplary structure includes a multi-layer back surface field (BSF) layer that may provide a higher band gap BSF layer as compared to some known structures. Accordingly, the BSF layer may function more efficiently as a BSF layer and/or the efficiency of the structure may be improved. Moreover, exemplary structures described herein may permit greater p-doping of at least one layer of the BSF layer than is possible with some known structures. In contrast with at least some known structures, the exemplary structures described herein may include a BSF layer doped with carbon, which will not diffuse into the base of the PV cell, rather than with zinc.

Figure 1:
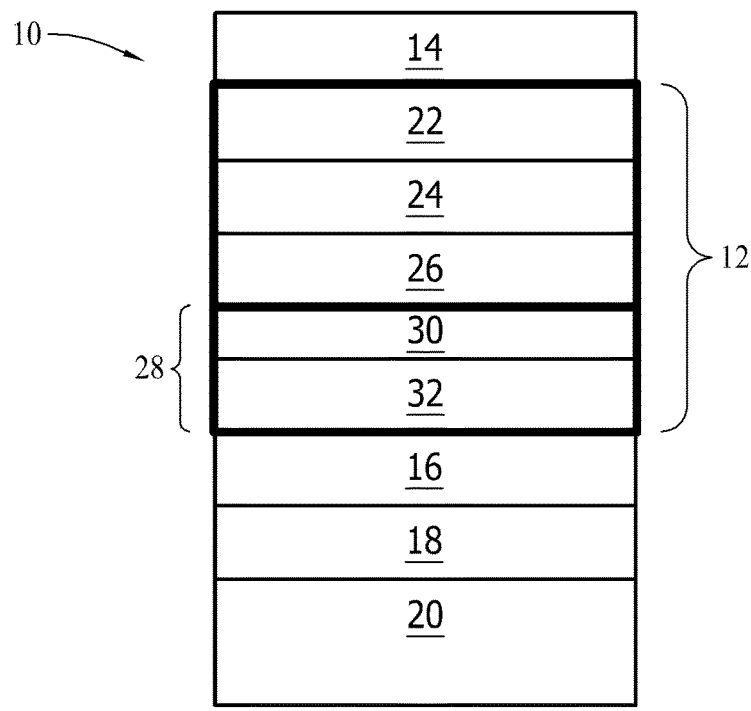
FIG. 1 is a cross section schematic view of an exemplary photovoltaic cell structure.

FIG. 1 is a cross sectional schematic view of an exemplary PV cell structure 10. In the exemplary embodiment, PV cell structure 10 is a single-junction PV structure. In other embodiments, PV cell structure 10 may be a multi-junction PV cell structure. PV cell structure 10 includes a PV cell 12, a cap layer 14, a buffer 16, a tunnel junction 18, and a substrate 20. PV cell 12 includes a window layer 22, an emitter layer 24, a base layer 26, and a BSF layer 28.

In the exemplary embodiment, emitter layer 24 is of a first doping type and base layer 26 of a second doping type. For example, if emitter layer 24 is n-type, then base layer 26 is typically p-type; and if emitter layer 24 is p-type, then base layer 26 is typically n-type. Accordingly, a p-n junction is formed between emitter layer 24 and base layer 26. In some embodiments, there may be variations in the doping concentration in emitter layer 24 and/or base layer 26. Such variations may be used to suppress minority-carrier concentration at the surfaces away from the p-n junction, and to enhance minority-carrier flow toward the collecting p-n junction. In the exemplary embodiment, emitter layer 24 and base layer 26 are fabricated from the same material, though doped differently. More specifically, in the exemplary embodiment, emitter layer 24 and base layer 26 are each fabricated from AlGaInP material. Even more specifically, in the exemplary embodiment, emitter layer 24 and base layer 26 each includes $(AlGa)_{0.32}In_{0.68}P$ material. In other embodiments, emitter layer 24 and base layer 26 may include any other suitable material and/or any other suitable formulation of AlGaInP. In the exemplary embodiment, emitter layer 24 and base layer 26 are lattice-matched to each other and establish a lattice constant of PV cell 12.

PV cell 12 includes window layer 22 positioned on top of emitter layer 24. In the exemplary embodiment, window layer 22 has the same doping type (e.g., p-type or n-type) as emitter layer 24. In some embodiments, window layer 22 has a higher doping concentration than emitter layer 24 and/or a higher bandgap than emitter layer 24. This difference facilitates suppressing minority-carrier photogeneration and injection in window layer 22, and thus reduces any recombination that would otherwise occur in window layer 22. In the exemplary embodiment, window layer 22 is lattice-mismatched with respect to emitter layer 24. In other embodiments, window layer 22 may be lattice-matched or nearly lattice-matched to emitter layer 24. Further, in the example embodiment, window layer 22 includes AlInP material. More specifically, window layer 22 includes $Al_{0.5}In_{0.5}P$ material. In other embodiments, window layer 22 may include any other suitable material and/or any other suitable formulation of AlInP.

In the exemplary embodiment, within PV cell 12, BSF layer 28 is adjacent to base layer 26. BSF layer 28 substantially prevents passage of minority carriers and passivates base layer 26 of PV cell 12. In the exemplary embodiment, BSF layer 28 has the same doping type (e.g., p-type or n-type) as base layer 26. In some embodiments, BSF layer 28 has a higher doping concentration than base layer 26 and a higher bandgap than base layer 26, to facilitate suppressing minority-carrier photogeneration and injection in BSF layer 28, and to facilitate reducing recombination at the interface between the base and BSF or in BSF layer 28.

BSF layer 28 includes a first (or upper) layer 30, and a second (or lower) layer 32. Upper layer 30 is located adjacent to, or below, base layer 26. Lower layer 32 is located adjacent to, or below, upper layer 30. Lower layer 32 is lattice-matched to the lattice constant of PV cell 12. Upper layer 30, however, is lattice-mismatched to base 26, and to the remaining layers of PV cell 12. More specifically, upper layer 30 is a strained pseudomorphic layer in which the atoms in upper layer 30 are strained to substantially align with the lattice structure of adjacent layer. More specifically, the atoms in upper layer 30 are strained without being plastically deformed as a metamorphic layer would be. The amount of strain in upper layer 30 is generally indicated by an amount of lattice-mismatch. Upper layer 30 is strained and thus has a lattice mismatch of greater than zero percent. In some embodiments, upper layer 30 is lattice-mismatched to base 26 by greater than about 0.5 percent. In still other embodiments, upper layer 30 is lattice-mismatched to base 26 by more than one percent. A layer, such as upper layer 30, with a lattice-mismatch of greater than about 0.5 percent may be referred to herein as "highly strained" or "fully strained."

Lower layer 32 of BSF layer 28 is lattice-matched to the lattice constant of emitter layer 24 and of base layer 26. In the exemplary embodiment, lower layer 32 includes AlGaInAs material. More specifically, in the exemplary embodiment, lower layer 32 includes $(AlGa)_{0.8}In_{0.2}As$. In other embodiments, other materials and/or formulations may be used. In the exemplary embodiment, lower layer 32 includes about twenty percent indium. In some embodiments, lower layer 32 includes more than twenty percent indium. In other embodiments, lower layer 32 includes between about one percent and twenty percent indium. In still other embodiments, lower layer 32 includes between about ten percent and twenty percent indium. Although lower layer 32 is lattice-matched to base layer 26, and could be used as a BSF without upper layer 30, the indium in lower layer 32 results in a relatively low bandgap, which may result in relatively poor performance as a BSF. In the exemplary embodiment, lower layer 32 has a bandgap of below 2.0 eV.

In the exemplary embodiment, upper layer 30 includes an indium-free material. More specifically, upper layer 30 includes AlGaAs. Even more specifically, upper layer 30 includes $Al_{0.8}Ga_{0.2}As$. Thus, in the exemplary embodiment, upper layer 30 includes about eighty percent aluminum. As used herein, an aluminum content greater than about fifty percent may be referred to as a "high" aluminum content. The increased aluminum content of upper layer 30 over the BSF layer in some known structures and over lower layer 32 results in an increased indirect bandgap. The bandgap of upper layer 30 is preferably between about 4.95 eV and about 2.1 eV. In other embodiments, other materials and/or formulations may be used. For example, in some embodiments, the aluminum content of upper layer 30 may be between about twenty percent and about one-hundred percent. In other embodiments, the aluminum content may be greater than about sixty percent. In still other embodiments, the aluminum content of upper layer 30 is greater than or equal to about eighty percent. Upper layer 30 is lattice-mismatched to the lattice constant of PV cell 12 and is a fully strained layer that has a higher bandgap than lower layer 32. The increased bandgap permits upper layer 30, and accordingly BSF layer 28 as a whole, to function more effectively as a BSF for minority carriers by reducing injection of minority carriers from base layer 26 into BSF layer 28, where the minority-carrier lifetime is low. Further, because upper layer 30 does not include indium, p-type doping of upper layer 30 may be achieved using carbon. More specifically, in the exemplary embodiment, upper layer 30 may be p-doped to about $10^{20}$cm$^{-3}$. In other embodiments, upper layer 30 may include p-doping of greater than about $10^{18}$cm$^{-3}$. In contrast, materials that contain indium, such as lower layer 32 experience difficulty with p-type doping using carbon due to an indium etching effect by the carbon source material. In the exemplary embodiment, lower layer 32 is p-doped to less than about $10^{18}$cm$^{-3}$.

A series of sample PV cells 12 were produced with varying thicknesses of upper layer 30 and tested. The results of these tests are illustrated in FIGS. 2-5. In all sample cells, lower layer 32 was (AlGa)$_{0.8}$In$_{0.2}$As lattice-matched with base layer 26. Moreover, in all sample cells with an upper layer 30, upper layer 30 was a highly strained Al$_{0.8}$Ga$_{0.2}$As layer. The first sample cell was produced without upper layer 30 as an initial reference or control. The second sample included upper layer 30 with a thickness t1 between about 1 nm and about 4 nm. The third sample included upper layer 30 with thickness t2 between about 4 nm and about 8 nm. The fourth sample included upper layer 30 with thicknesses t3 between about 9 nm and 15 nm. The thicknesses of upper layer 30 in the sample cells 12 are exemplary only. The thickness of upper layer 30 may vary above and/or below the thicknesses stated above. In particular, upper layer 30 may vary in thickness depending on the lattice constant of the material used for upper layer 30 and the other layers of cell 12.

Figure 2:
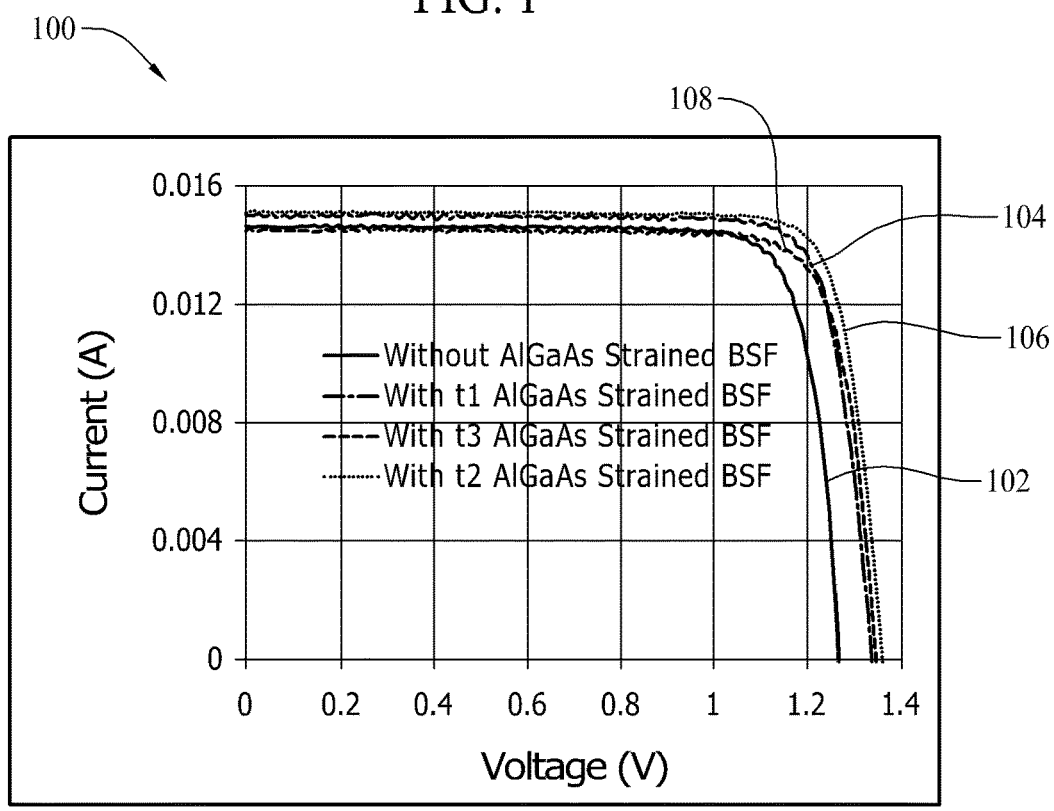
FIG. 2 is an exemplary graph of current as a function of voltage for four sample photovoltaic cell structures fabricated based on the photovoltaic structure shown in FIG. 1.

FIG. 2 is an exemplary graph 100 of current as a function of voltage (commonly referred to as an I-V curve) for each of the four sample cells. More specifically, trace 102 corresponds to the first sample cell, trace 104 corresponds to the second sample cell, trace 106 corresponds to the third sample cell, and trace 108 corresponds to the fourth sample cell. Traces 104-108 illustrate a greater open circuit voltage than trace 102. As such, the addition of strained upper layer 30 improved performance over the first sample cell without strained upper layer 30. As the thickness of upper layer 30 was increased from t2 to t3 (trace 108), the open circuit voltage decreased because the strained upper layer 30 was partially relaxed.

Figure 3:
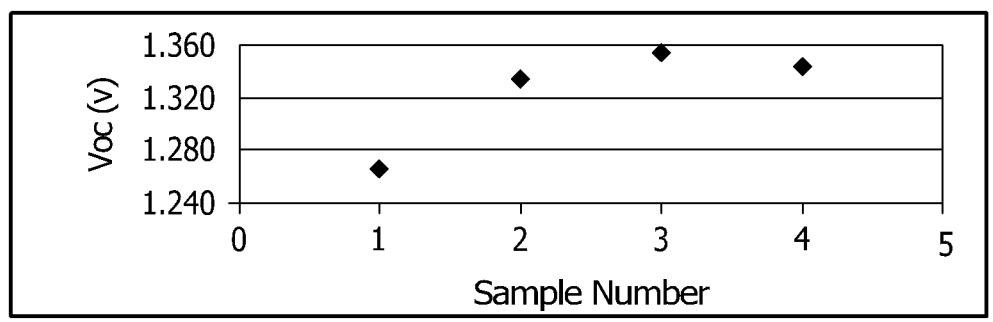
FIG. 3 is an exemplary plot of open circuit voltage for the four sample photovoltaic cell structures shown in FIG. 2.
Figure 4:
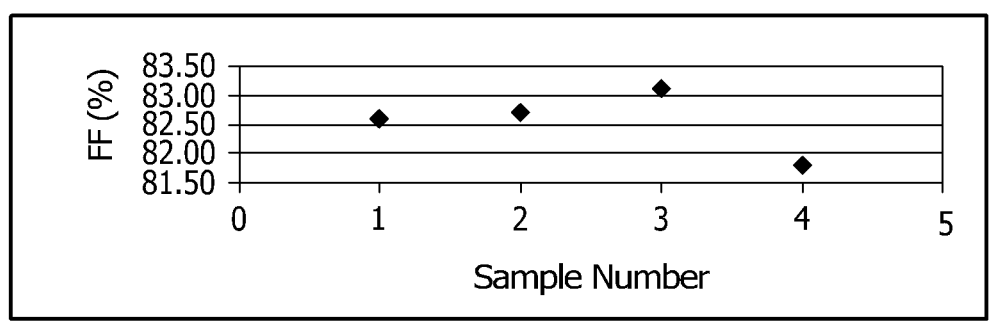
FIG. 4 is an exemplary plot of fill factor for the four sample photovoltaic cell structures shown in FIG. 2.
Figure 5:
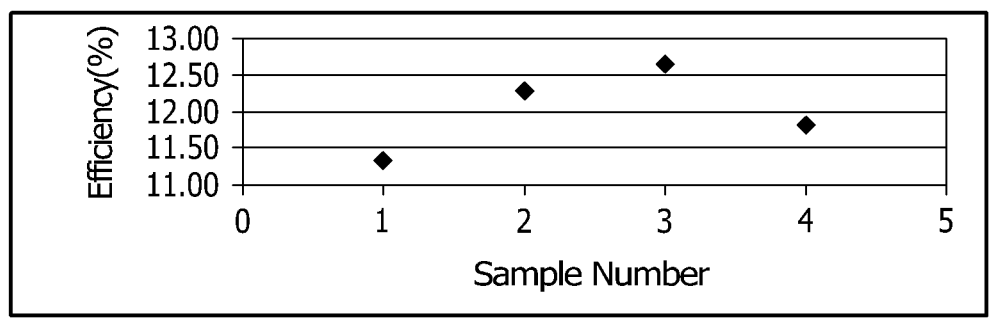
FIG. 5 is an exemplary plot of efficiency for the four sample photovoltaic cell structures shown in FIG. 2.

FIGS. 3-5 are exemplary plots of open circuit voltage (Voc), fill factor (FF), and efficiency, respectively, for the four sample cells graphed in FIG. 2. FIGS. 3-5 demonstrate the increased open circuit voltage, fill factor, and efficiency provided by the addition of strained upper layer 30. Each of these performance measures generally increases over the first (control) sample as the thickness of strained upper layer 30 increases. When the thickness of upper layer 30 exceeds some thickness greater than the third sample (t2), open circuit voltage, fill factor and efficiency begin to decline. Except for efficiency, however, all of these performance measures still exceed those for the control sample at the thickest upper layer 30 tested (t3).

Figure 6:
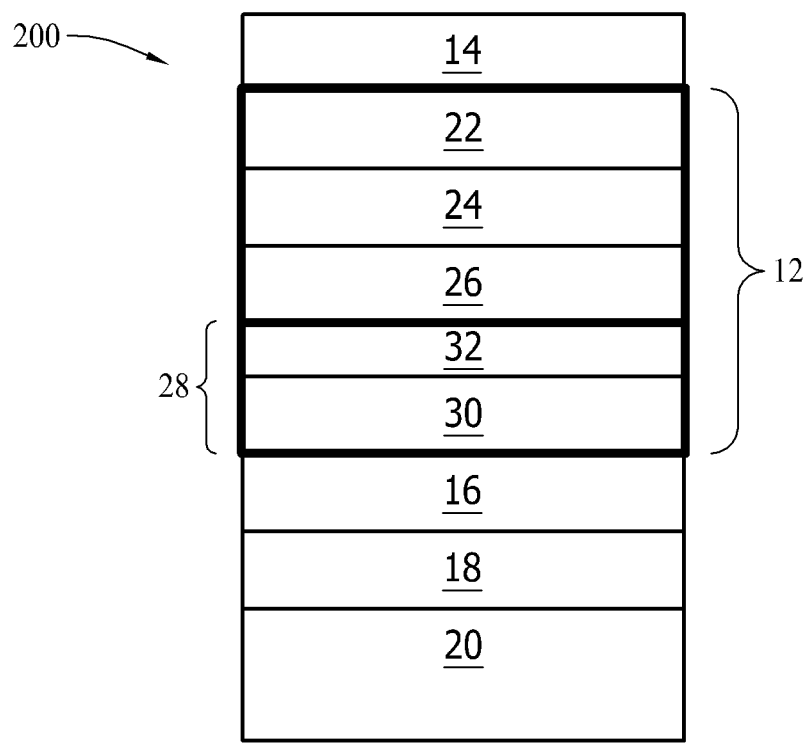
FIG. 6 is a cross section schematic view of an exemplary photovoltaic cell structure.
Figure 7:
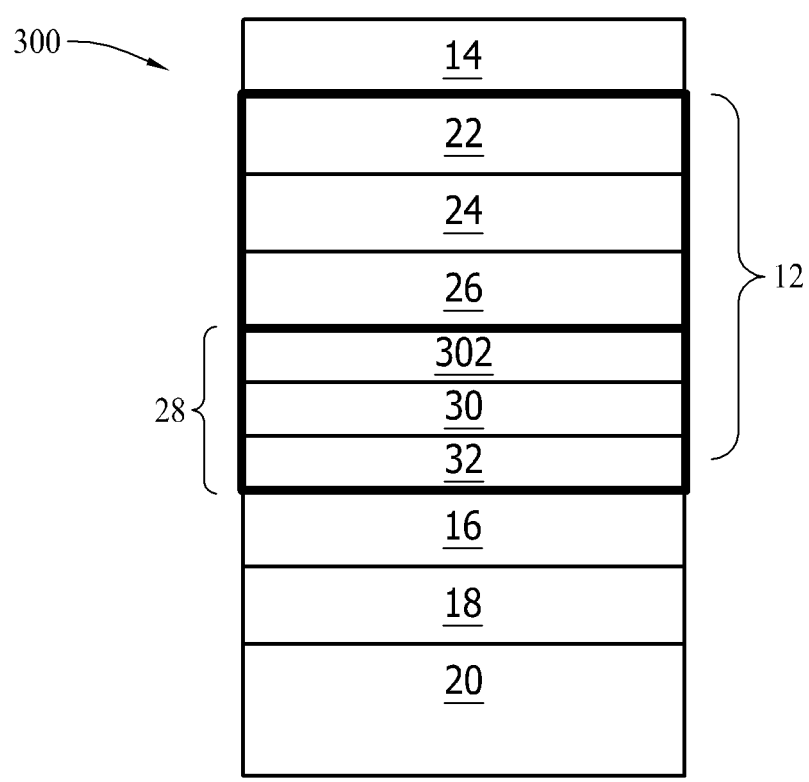
FIG. 7 is a cross section schematic view of another exemplary photovoltaic cell structure.

FIG. 6 is a cross sectional schematic view of an exemplary PV cell structure 200. PV cell structure 200 is similar to PV cell structure 10 (shown in FIG. 1) and common reference numerals are used to indicate common elements. In PV cell structure 200, BSF first layer 30 is located between second layer 32 and buffer 16. FIG. 7 is a cross sectional schematic view of another exemplary PV cell structure 300. PV cell structure 300 is similar to PV cell structures 10 (shown in FIGS. 1) and 200 (shown in FIG. 6). Common reference numerals are used to indicate common elements. In PV cell structure 300, BSF layer 28 includes a third layer 302. First layer 30 is located between second layer 32 and third layer 302. In the exemplary embodiment, third layer 302 generally includes the same materials and formulation as second layer 32. More specifically, third layer 302 includes AlGaInAs material. Even more specifically, in the exemplary embodiment, third layer 302 includes (AlGa)$_{0.8}$In$_{0.2}$As. In other embodiments, other materials and/or formulations may be used. In the exemplary embodiment, third layer 302 and second layer 32 are substantially the same thickness. In other embodiments, third layer 302 may be thicker or thinner than second layer 32.

The PV cell structures described herein include an indium-free highly strained layer as part of the BSF at the cell base side. This BSF layer has a higher bandgap and may operate better in a minority carrier blocking role than some known cell structures. Moreover, the BSF layer is relatively thin, is within the Mathews-Blakeslee critical thickness, and is a fully strained pseudomorphic layer. Hence, this layer passivates well the base-BSF interface. Further, the strained layer is indium-free with a relatively high aluminum content. The high aluminum content of the strained layer results in an increased indirect bandgap, thereby increasing the effectiveness of the BSF layer and increasing the overall efficiency of the PV cell structure over some known structures. Further, due to the lack of indium, the layer can be highly p-doped with carbon to form band bending to more effectively block minority carriers. Accordingly, PV cell structures described herein provide a BSF layer that may be more easily doped with carbon and provide increased performance over at least some known PV cell structures.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. A photovoltaic (PV) cell comprising:
an emitter layer;
a base layer adjacent to the emitter layer; and
a back surface field (BSF) layer adjacent to the base layer, the BSF layer comprising:
a first layer comprising a first material, the first layer adjacent to the base layer, wherein the first material is indium free, and wherein the first layer is fully strained and has a thickness of between 1 nm and 8 nm; and a second layer adjacent to the first layer and comprising a second material different than the first material, wherein the second material contains indium, wherein the second layer of the back surface field layer is lattice-matched to the base layer, wherein the first layer of the back surface field layer is lattice-mismatched to the base layer, and wherein a first bandgap of the first layer is larger than a second bandgap of the second layer.

2. A PV cell in accordance with claim 1, wherein the first layer of the back surface field layer is p-doped using carbon.

3. A PV cell in accordance with claim 1, wherein the emitter layer and the base layer each comprise AlGaInP materials.

4. A PV cell in accordance with claim 3, wherein the first material of the first layer of the back surface field layer comprises AlGaAs material.

5. A PV cell in accordance with claim 4, wherein the second material of the second layer of the back surface field layer comprises AlGaInAs material.

6. A PV cell in accordance with claim 5, wherein the first material of the first layer has a higher aluminum content compared to the second material of the second layer.

7. A PV cell in accordance with claim 1, wherein the first layer of the back surface field layer is thinner than the second layer of the back surface field layer.

8. A photovoltaic (PV) cell comprising:
an emitter layer;
a base layer adjacent to the emitter layer; and
a back surface field (BSF) layer adjacent to the base layer, the BSF layer comprising:
a first layer comprising a first material, the first layer adjacent to the base layer, and wherein the first layer is fully strained and has a thickness of between 1 nm and 8 nm; and
a second layer adjacent to the first layer and comprising a second material different than the first material, wherein the first layer of the BSF layer is lattice-mismatched to the base layer, wherein the first material of the first layer of the BSF layer comprises an AlGaAs material, the second material of the second layer of the BSF layer comprises an AlGsInAs material, the second layer of the BSF layer is lattice-matched to the base layer, and wherein a first bandgap of the first layer is larger than a second bandgap of the second layer.

9. A PV cell in accordance with claim 8, wherein the first layer of the BSF layer is p-doped using carbon.

10. A PV cell in accordance with claim 8, wherein the emitter layer and the base layer each comprise AlGaInP materials.

11. A PV cell in accordance with claim 8, wherein the first material of the first layer has a higher aluminum content compared to the second material of the second layer.

12. A PV cell in accordance with claim 8, wherein the first layer of the BSF layer is thinner than the second layer of the BSF layer.

13. A PV cell in accordance with claim 8, wherein the first layer has a higher bandgap than the second layer.

14. A photovoltaic (PV) cell comprising:
an emitter layer comprising a first material having a first doping;
a base layer having a first side adjacent to the emitter layer and a second side, the base layer comprising the first material having a second doping that is opposite to the first doping; and
a back surface field (BSF) layer adjacent to the base layer, the back surface field (BSF) layer comprising:
a first, strained layer adjacent to the second side of the base layer and comprising a second, indium-free material made of AlGaAs having an aluminum content greater than 50%, the first, strained layer having a first bandgap between 4.95 eV and 2.1 eV, and wherein the first, strained layer is fully strained and has a thickness of between 1 nm and 8 nm; and
a second layer adjacent to the first, strained, layer and comprising a third material made of AlGaInAs and a second bandgap, wherein the In in the third material reduces the second bandgap to below 2.0 eV and wherein the second layer of the BSF layer is lattice-matched to the base layer, and wherein a first bandgap of the first layer is larger than a second bandgap of the second layer.

15. A PV cell in accordance with claim 14, wherein the first, strained layer of the BSF layer is lattice-mismatched to the base layer.

16. A PV cell in accordance with claim 14, wherein the emitter layer and the base layer each comprise AlGaInP materials.

17. A PV cell in accordance with claim 14, wherein the first, strained layer of the BSF layer is thinner than the second layer of the BSF layer.

18. A PV cell in accordance with claim 14, wherein the second, indium-free material of the first, strained layer has a higher aluminum content compared to the third material of the second layer.

19. A PV cell in accordance with claim 14, wherein the first, strained layer of the BSF layer is p-doped using carbon.

* * * * *